US009530637B2

(12) United States Patent
Zhang et al.

(10) Patent No.: US 9,530,637 B2
(45) Date of Patent: Dec. 27, 2016

(54) FIN STRUCTURE FORMATION BY SELECTIVE ETCHING

(71) Applicant: Applied Materials, Inc., Santa Clara, CA (US)

(72) Inventors: Ying Zhang, Santa Clara, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/875,013

(22) Filed: Oct. 5, 2015

(65) Prior Publication Data

US 2016/0099178 A1    Apr. 7, 2016

Related U.S. Application Data

(60) Provisional application No. 62/059,932, filed on Oct. 5, 2014.

(51) Int. Cl.
| | |
|---|---|
| *H01L 21/20* | (2006.01) |
| *H01L 21/02* | (2006.01) |
| *H01L 21/3065* | (2006.01) |
| *H01L 21/308* | (2006.01) |
| *H01L 21/311* | (2006.01) |
| *H01L 21/8258* | (2006.01) |

(52) U.S. Cl.
CPC ..... *H01L 21/02507* (2013.01); *H01L 21/0245* (2013.01); *H01L 21/02164* (2013.01); *H01L 21/02274* (2013.01); *H01L 21/02381* (2013.01); *H01L 21/02532* (2013.01); *H01L 21/02639* (2013.01); *H01L 21/3065* (2013.01); *H01L 21/3086* (2013.01); *H01L 21/31116* (2013.01); *H01L 21/8258* (2013.01)

(58) Field of Classification Search
CPC .............................................. H01L 21/823431
USPC ........................................................ 438/478
See application file for complete search history.

(56) References Cited

U.S. PATENT DOCUMENTS

| | | | |
|---|---|---|---|
| 6,875,703 B1* | 4/2005 | Furukawa | H01L 21/0337 257/E21.038 |
| 7,202,494 B2 | 4/2007 | Blanchard et al. | |
| 8,697,514 B2 | 4/2014 | Butt et al. | |
| 2006/0292889 A1* | 12/2006 | Blanchard | B82Y 10/00 438/761 |
| 2013/0196508 A1* | 8/2013 | LiCausi | H01L 21/82382 438/696 |
| 2014/0327044 A1 | 11/2014 | Leobandung | |
| 2015/0050800 A1 | 2/2015 | Brand et al. | |
| 2015/0243503 A1* | 8/2015 | Leobandung | H01L 21/0337 438/427 |

* cited by examiner

*Primary Examiner* — Anthony Ho
(74) *Attorney, Agent, or Firm* — Patterson & Sheridan, LLP

(57) ABSTRACT

Methods and apparatus for forming FinFET structures are provided. Selective etching and deposition processes described herein may provide for FinFET manufacturing without the utilization of multiple patterning processes. Embodiments described herein also provide for fin material manufacturing methods for transitioning from silicon to III-V materials while maintaining acceptable crystal lattice orientations of the various materials utilized. Further embodiments provide etching apparatus which may be utilized to perform the methods described herein.

19 Claims, 9 Drawing Sheets

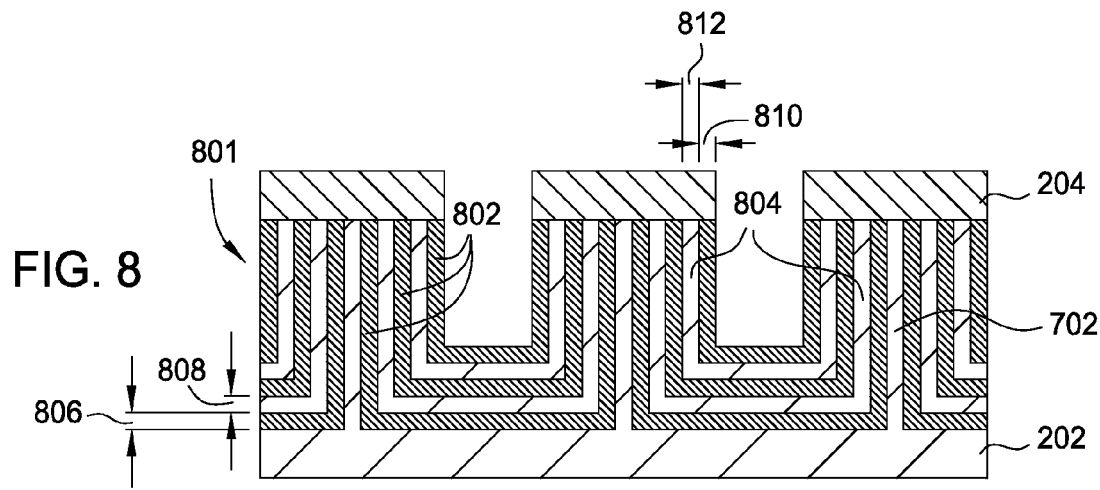
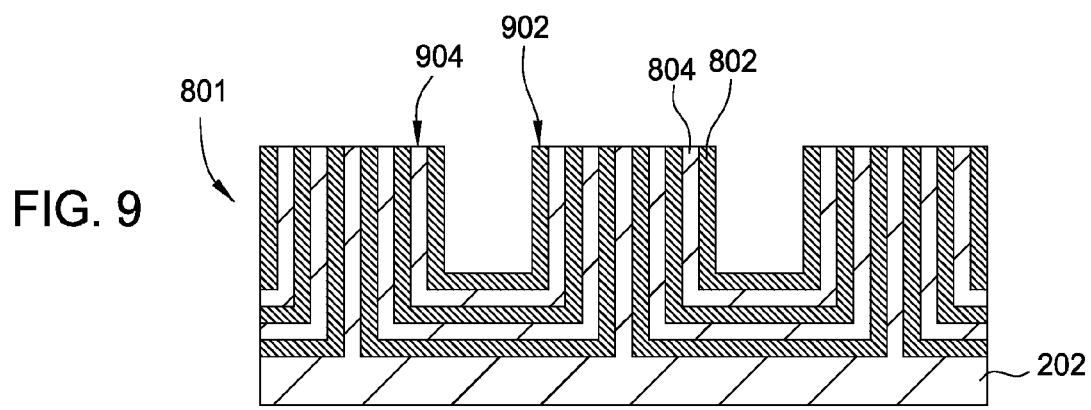
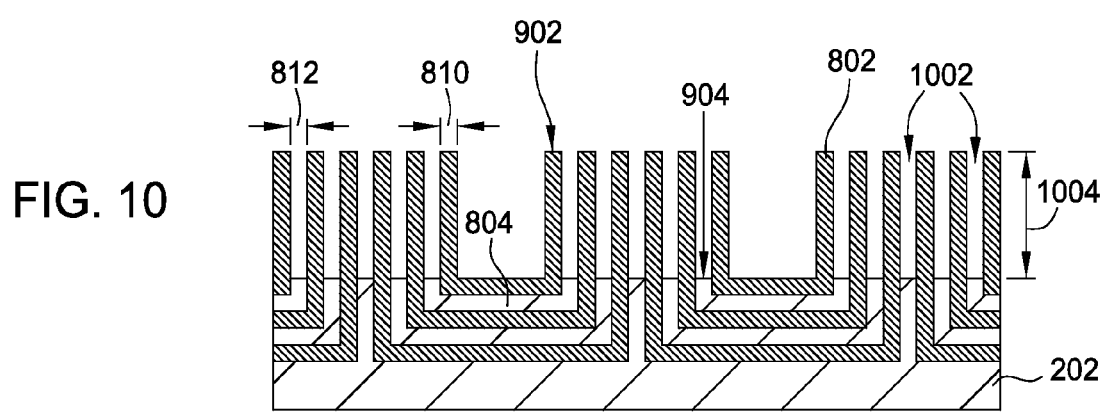

FIN STRUCTURE FORMATION BY SELECTIVE ETCHING

CROSS-REFERENCE TO RELATED APPLICATIONS

This application claims benefit of U.S. Provisional Patent Application No. 62/059,932, filed Oct. 5, 2014, the entirety of which is herein incorporated by reference.

BACKGROUND

Field

Embodiments of the present disclosure generally relate to methods and apparatus for forming fin field-effect transistor (FinFETs) structures. More specifically, embodiments described herein relate to fin structure formation by selective etching and deposition processes.

Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator substrates. The substrate may comprise a semi-conducting substrate and an oxide layer disposed on the semiconducting substrate.

When manufacturing FinFETs, it is desirable to have a fin structure with a high aspect ratio. A higher aspect ratio for the fin structure allows a larger amount of current to be provided through the same amount of topographical area. Fabrication of high aspect ratio FinFETs is difficult as a result of the reduced critical dimensions required for sub-10 nm nodes. Forming sub-10 nm node FinFET structures is further complicated by limitations and increased complexities of various patterning and lithography processes.

For example, multiple patterning processes, such as self-aligned double patterning (SADP) and self-aligned quadruple patterning (SAQP) processes, may not adequately provide reliable patterning given the small pitch size requirements associated with formation of sub-10 nm node FinFET structures. Other lithography processes, such as litho-etch-litho-etch (LELE) processes which utilize 193 nm immersion photolithography, may increase the line width roughness (LWR) of a resist used to pattern features on the substrate. The increase in LWR may lead to variations in threshold voltages, such as "hot spots" or areas of lower resistance, of the subsequently formed fin features and ultimately result in poor device performance. Moreover, current lithography and patterning processes are time consuming, which reduces throughput for device processing.

Thus, what is needed in the art are methods and apparatus for manufacturing FinFET structures.

SUMMARY

In one embodiment, a method for forming a semiconductor device is provided. The method includes patterning and etching a substrate to form one or more first mandrel structures and conformally depositing a first material layer on the substrate and the first mandrel structures. A second material layer may be conformally deposited on the first material layer and the first material layer may be conformally deposited on the second material layer. The conformally depositing the second material layer on the first material layer and the conformally depositing the first material layer on the second material layer may be repeated to form a superlattice structure. A portion of the first mandrel structures and the second material layer may be removed to form a plurality of second mandrel structures.

In another embodiment, a method of forming a semiconductor device is provided. The method includes patterning and etching a substrate to form one or more first mandrel structures and conformally depositing a first material layer on the substrate and the first mandrel structures. A second material layer may be conformally deposited on the first material layer and the first material layer may be conformally deposited on the second material layer. The conformally depositing the second material layer on the first material layer and the conformally depositing the first material layer on the second material layer may be repeated to form a superlattice structure. A portion of the superlattice structure may be masked and an unmasked portion of the superlattice structure may be removed to expose a portion of the substrate.

In yet another embodiment, a method of forming a semiconductor device is provided. The method includes epitaxially depositing a first silicon germanium material layer on a silicon substrate having one or more silicon mandrel structures formed thereon and epitaxially depositing a first silicon layer on the first silicon germanium layer. A second silicon germanium layer may be epitaxially deposited on the first silicon layer. The epitaxially depositing a first silicon layer on the first silicon germanium layer and the epitaxially depositing the second silicon germanium layer on the first silicon layer may be repeated to form a superlattice structure. A portion of the one or more silicon mandrel structures and the first silicon layer may be removed to form a plurality of silicon germanium mandrel structures. A III-V material may be epiaxially deposited on sidewalls of the silicon germanium mandrels structures and the silicon germanium mandrels structures may be removed to form a plurality of III-V material mandrel structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 8 illustrates a partial, cross-sectional view of a substrate after formation of a superlattice structure.

FIG. 9 illustrates a partial, cross-sectional view of a substrate after a hardmask removal process.

FIG. 10 illustrates a partial, cross-sectional view of a substrate after a second mandrel structure formation process.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods and apparatus for forming FinFET structures. Selective etching and deposition processes described herein may provide for FinFET manufacturing while reducing or eliminating the utilization of multiple patterning processes. Embodiments described herein also provide for fin structure manufacturing methods for transitioning from silicon to III-V materials while maintaining acceptable crystal lattice orientations of the various materials utilized. Further embodiments provide etching apparatus which may be utilized to perform the methods described herein.

Patterning processes utilized to pattern and subsequently etch the substrate generally provide a template for superlattice structure formation. A superlattice structure as defined herein may be a two or more layers comprising different materials deposited on and adjacent one another. A thickness of one of the layer is generally several nanometers and the layers may be deposited in a repeating process to form a plurality of alternating layers. Generally, the layers may be deposited conformally by a selective epitaxial deposition process. The superlattice structure and substrate may then be selectively etched to removed desired portions of the substrate and superlattice structure to form mandrel structures. The resulting mandrel structures may function as a templates for additional feature formation or may serve as functional device features, such as a FinFET structure. The methods described herein advantageously provide for simplified patterning processes while enabling sub-10 nm node FinFET formation for advanced node semiconductor devices.

Figure 1:
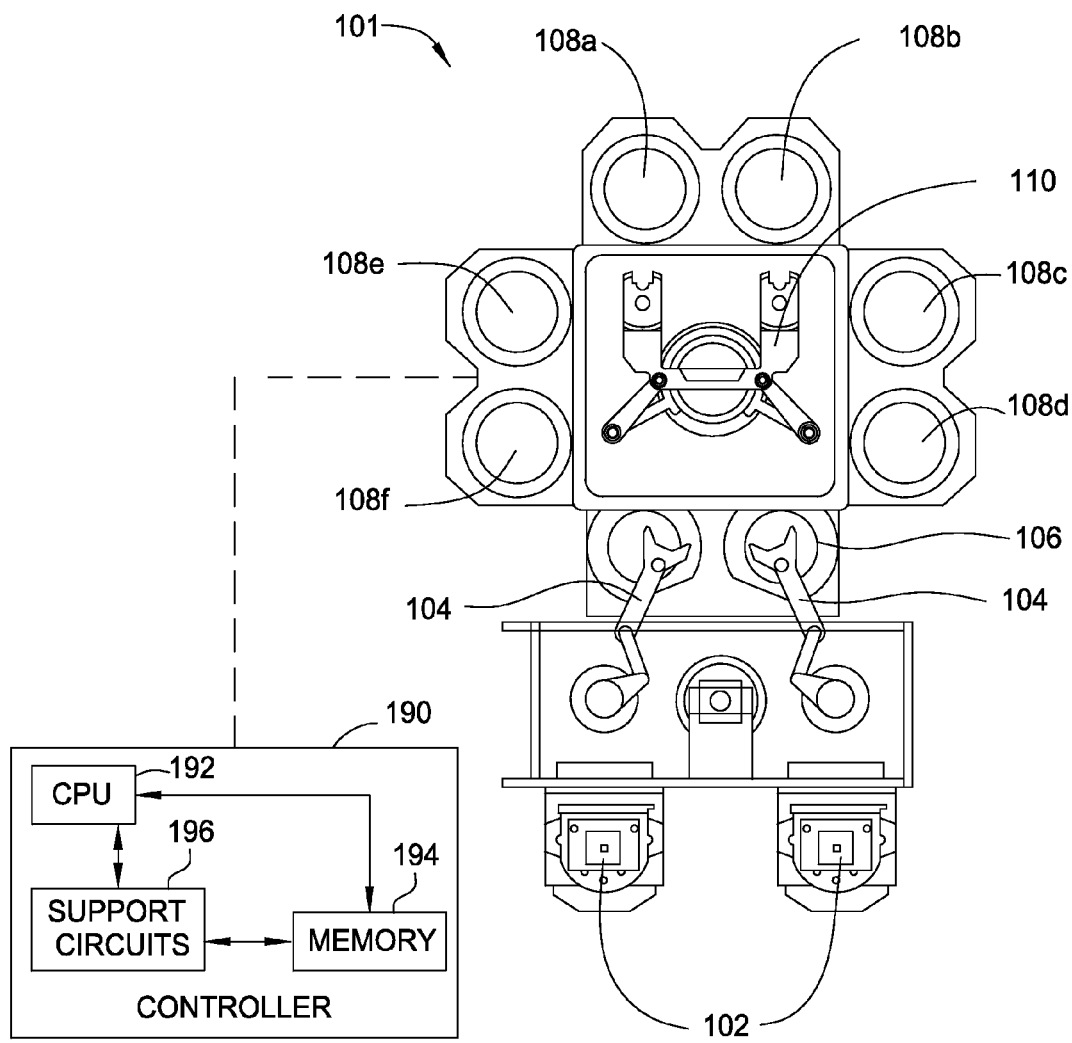
FIG. 1 illustrates a schematic, plan view of an exemplary processing system in which embodiments of the disclosure may be practiced.

FIG. 1 illustrates a schematic, plan view of a processing system 101 which may be utilized to perform the methods described herein. The processing system 101 may perform various processes, such as deposition processes, etching processes, and baking and curing processes, among others. The processing system 101 includes a pair of front opening unified pods 102. Substrates are generally provided from the front opening unified pods 102. One or more first robots 104 retrieve the substrates from the front opening unified pods 102 and place the substrates into a loadlock chamber 106. One or more second robots 110 transport the substrates from the loadlock chamber 106 to one or more processing chambers 108a-108f. Each of the processing chambers 108a-108f may be configured to perform a number of substrate processing operations, such as dry etching, epitaxial layer deposition, atomic layer deposition (ALD), chemical vapor deposition (CVD), physical vapor deposition (PVD), preclean, degas, orientation, and other substrate processes.

The substrate processing chambers 108a-108f may include one or more system components for depositing, annealing, curing and/or etching a material deposited on a substrate. In one configuration, two pairs of the processing chambers, for example, 108c-108d and 108e-108f, may be used to deposit a material on the substrate, and the third pair of processing chambers, for example, 108a-108b, may be used to remove material from the substrate. In another configuration, all of the processing chambers 108a-108f may be configured to remove material from the substrate. In this configuration, each pair of processing chambers, 108a-108b, 108c-108d, 108e-108f, may be configured to perform a selective etching process.

In one embodiment, processing chambers 108a-108b may be configured to selectively etch silicon and various hardmask materials utilizing a dry plasma etching process. Processing chambers 108c-108d may be configured to selectively etch semiconducting materials, such as silicon, silicon germanium, germanium, and III-V material, utilizing a dry plasma etching process. Processing chambers 108e-108f may be configured to selectively remove mask materials in a low temperature process. In one embodiment, the processing chambers 108e-108f utilize an electron beam to form a plasma. The processing system 101 described herein may be utilized to perform the processes described herein. Additionally, any one or more of the processes described herein may be performed in chamber(s) separated from the processing system 101.

The above-described processing system 101 can be controlled by a processor based system controller such a controller 190. For example, the controller 190 may be configured to control flow of various precursor and process gases and purge gases from gas sources, during different stages of a substrate process sequence. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing system 101 to facilitate control of the substrate processing. The controller 190 also includes hardware for monitoring substrate processing through sensors in the processing system 101, including sensors monitoring the precursor, process gas and purge gas flow. Other sensors that measure system parameters such as substrate temperature, chamber atmosphere pressure and the like, may also provide information to the controller 190.

To facilitate control of the processing system 101 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Deposition, etching, and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the processing system 101. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
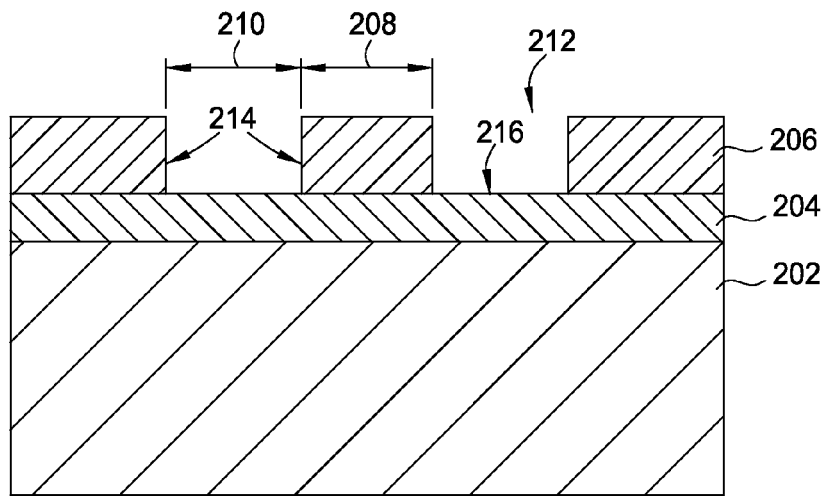
FIG. 2 illustrates a partial, cross-sectional view of a substrate.

FIG. 2 illustrates a partial, cross-sectional view of a substrate 202. The substrate 202 comprises a semiconducting material, such as silicon, and may be a silicon-on-insulator substrate. The substrate 202 may comprise a monocrystalline silicon material which is either an intrinsic (un-doped) silicon material or an extrinsic (doped) silicon material. If an extrinsic silicon material is utilized, the dopant may be a p-type dopant, such as boron.

In the example illustrated in FIG. 2, a hardmask layer 204 is disposed on the substrate 202 and a resist layer 206, such as a photoresist, is disposed on the hardmask layer 204. In one example, the hardmask layer 204 comprises a silicon nitride material, however other hardmask layers which are capable of functioning as an etch stop may also be utilized. For example, depending upon pitch size and the lithography processes performed, more complex stack layers may be utilized as the hardmask layer 204. The hardmask layer 204 may have a thickness of between about 20 nm and about 40 nm, such as about 30 nm, however, any suitable thickness may be utilized. The resist layer 206 may be formed from any suitable resist material.

In a patterning process, such as a 193 nm immersion lithography process or directed self assembly (DSA) process, the resist layer 206 is exposed in a desired pattern and portions of the resist layer 206 are removed. The removed portions of the resist layer 206 result in the formation of one or more recesses 212 which are defined by a top surface 216 of the hardmask layer 204 and sidewalls 214 of the resist layer 206. A width 210 of the recess 212 may be between about 10 nm and about 200 nm, such as between about 50 nm and about 150 nm. In one embodiment, the recesses 212 formed by a 193 nm immersion lithography process may have a width of about 40 nm, however other widths may be obtained utilizing other suitable patterning processes. A width 208 of a portion of the resist layer 206 adjacent the recesses 212 may be between about 10 nm and about 200 nm, such as between about 50 nm and about 150 nm. Thus, a pitch (summation of widths 210 and 208) of the desired pattern may be between about 20 nm and about 400 nm, such as between about 75 nm and about 225 nm.

Figure 3:
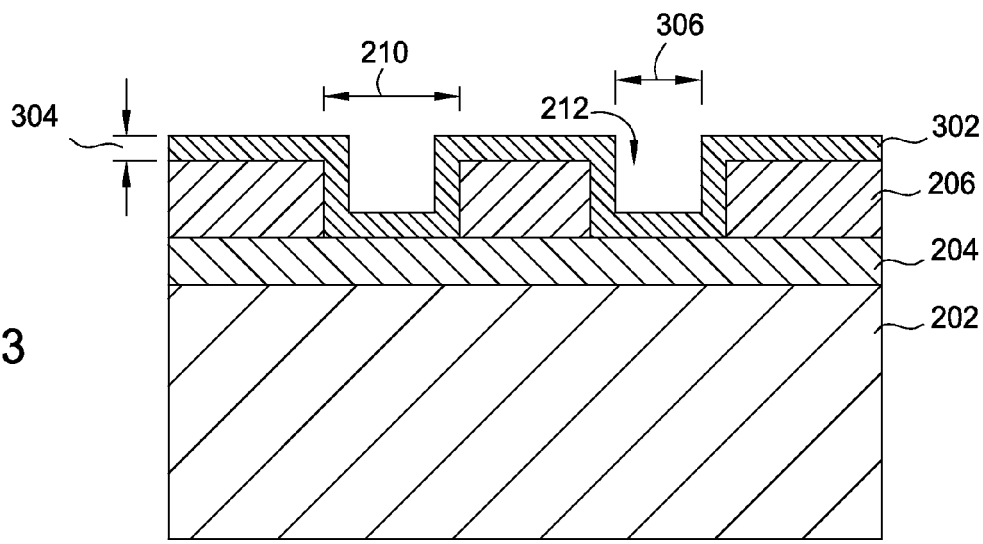
FIG. 3 illustrates a partial, cross-sectional view of a substrate after a sacrificial layer deposition process.

FIG. 3 illustrates a partial, cross-sectional view of the substrate 202 after a sacrificial layer deposition process. A sacrificial layer 302 may deposited conformally or substantially conformally on the patterned resist layer 206 and the exposed surfaces of the hardmask layer 204. The sacrificial layer 302, when deposited using suitable process conditions, may achieve step coverage (i.e. the degree of conformality of the deposited layer) of at least about 80% or more, for example about 100%. In one embodiment, the sacrificial layer 302 may be a carbon based material, such as an amorphous carbon (a-C) material. The amorphous carbon may be undoped or doped with nitrogen. In one example, the sacrificial layer 302 is a nitrogen-doped amorphous carbon layer. The nitrogen-doped amorphous carbon layer may be deposited by any suitable deposition techniques, such as a plasma enhanced chemical vapor deposition (PECVD) process. A thickness 304 of the sacrificial layer 302 may be between about 5 Å and about 200 Å. In one example, the thickness 304 of the sacrificial layer 302 may be about 15 nm. In this example, if the width 210 of the recesses 212 is about 40 nm, a trimmed recess width 306 may be between about 5 nm and about 15 nm, such as about 10 nm.

Figure 4:
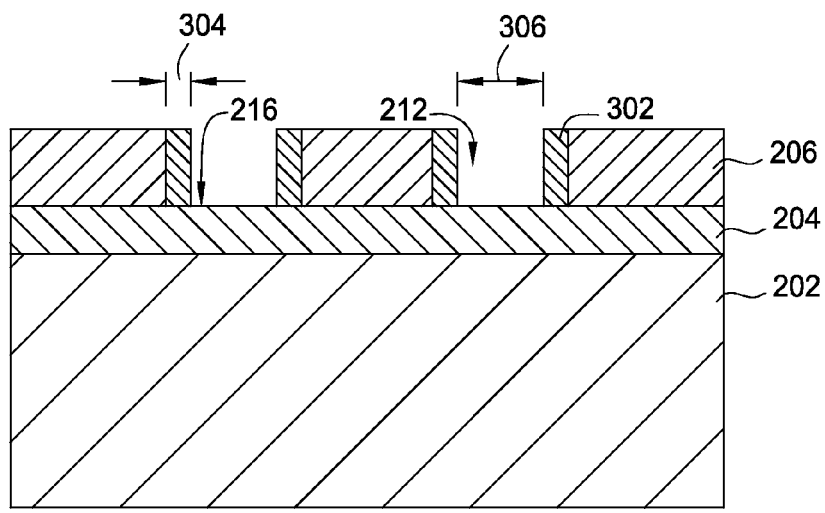
FIG. 4 illustrates a partial, cross-sectional view of a substrate after a sacrificial layer etching process.

FIG. 4 illustrates a partial, cross-sectional view of the substrate 202 after a sacrificial layer etching process. Portions of the sacrificial layer 302 may be removed by an etching process such that the sacrificial layer 302 remains predominantly adjacent the sidewalls of the resist layer 206 within the recesses 212. A selective anisotropic etching process utilizing suitable chemistries may remove portions of the sacrificial layer 302 from the resist layer 206 and the top surface 216 of the hardmask layer 204. The types of etchants utilized may be chosen such that the etchants remove predominantly the sacrificial layer 302 and are generally non-reactive with the hardmask layer 204 and the resist layer 206. As previously mentioned, the resulting recesses 212 have a trimmed width 306 which is utilized in subsequent patterning processes.

Figure 5:
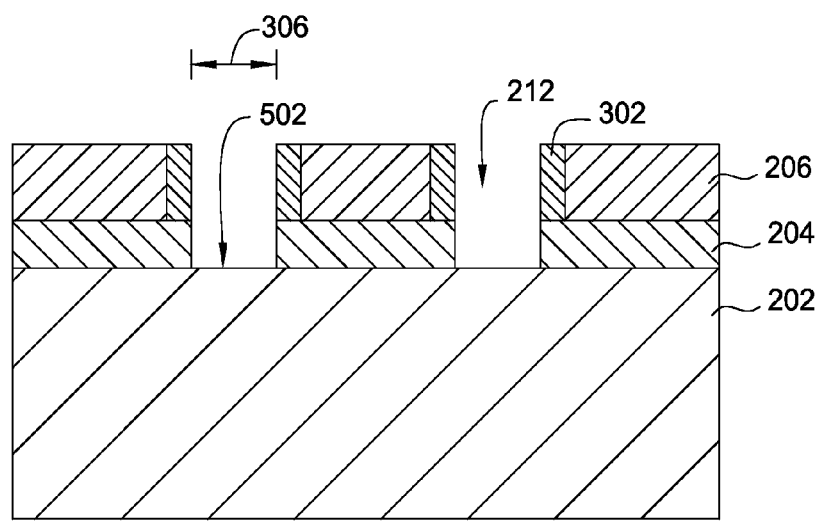
FIG. 5 illustrates a partial, cross-sectional view of a substrate after a hardmask layer etching process.

FIG. 5 illustrates a partial, cross-sectional view of the substrate 202 after a hardmask layer etching process. The trimmed width 306 of the recess 212 illustrated in FIG. 4 serves as a pattern for etching the hardmask layer 204. The hardmask layer 204 may be etched using a selective anisotropic etching process. For example, a fluorocarbon etchant, such as $CF_4$, may be utilized to predominantly remove the exposed regions of the hardmask layer 204. The selective hardmask layer removal process may proceed for a suitable amount of time until a top surface 502 of the substrate is exposed. The etchants utilized to remove the hardmask layer 204 are selected to remove predominantly the hardmask layer material and are generally non-reactive with the sacrificial layer 302, the resist layer 206, and the substrate 202. In one embodiment, exposed regions of the hardmask layer 204 may be removed in a single chamber etching process, such as one of the chambers 108e-108f.

Figure 6:
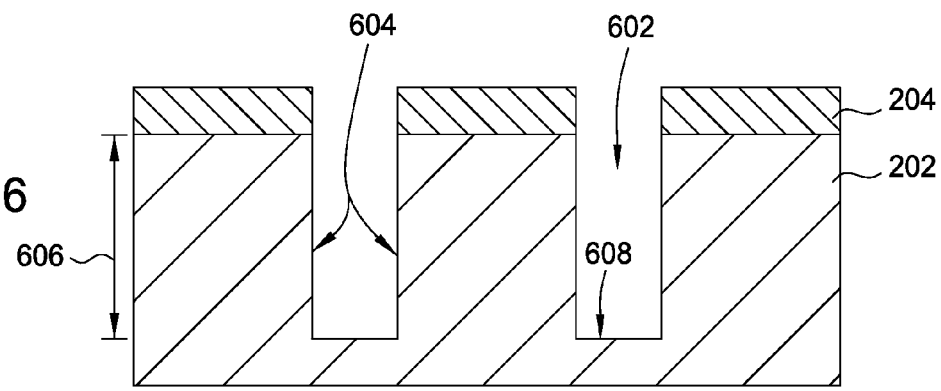
FIG. 6 illustrates a partial, cross-sectional view of a substrate after an etching process and patterning material removal process.

FIG. 6 illustrates a partial, cross-sectional view of the substrate 202 after an etching process and patterning material removal process. The resist layer 206 and sacrificial layer 302 may be removed sequentially or simultaneously with the etching of the substrate 202. For example, the resist layer 206 and the sacrificial layer 302 may be removed prior to etching the substrate 202 or subsequent to etching the substrate 202. Alternatively, the resist layer 206 and the sacrificial layer 302 may be removed during the substrate etching process.

The substrate etching process generally defines one or more recesses 602 in the substrate 202. The substrate recesses 602 may be defined by sidewalls 604 and a bottom surface 608. A depth 606 of the recesses 602 into the substrate 202 may be between about 100 nm and about 300 nm, such as between about 150 nm and about 250 nm, for example, about 200 nm. It is contemplated that a width of the recesses 602 may be substantially similar to the trimmed width 306 illustrated in FIG. 4 and FIG. 5.

In one embodiment, the substrate is a silicon material and a selective anisotropic etching process may be utilized to etch the substrate 202. In one example, halogen etchant materials, such as HBr and $Cl_2$, may be utilized to predominantly etch the substrate 202. The etching process may proceed for a suitable amount of time to define the recesses 602 with the desired depth 606. The substrate etching process may be performed in a first material removal chamber, such as the chamber 108e-108f. Another example of a chamber which may be utilized to perform the etching processes described above is the CENTRIS™ ADVANTEDGE MESA™ etch chamber available from Applied Materials, Inc., Santa Clara, Calif. It is contemplated that the dimensions of the recesses 602 may be formed by a single patterning process as mentioned above and subsequent lithographic patterning processes may not be necessary to form FinFET structures as described in the embodiments below.

Figure 7:
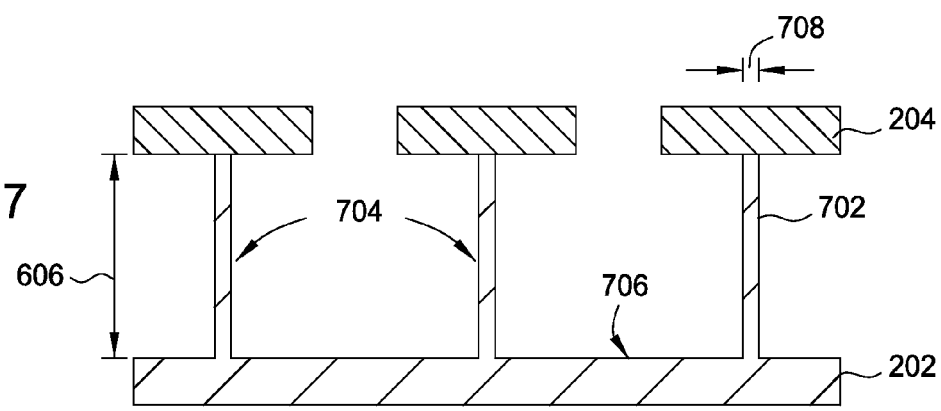
FIG. 7 illustrates a partial, cross-sectional view of a substrate after a first mandrel structure formation process.

FIG. 7 illustrates a partial, cross-sectional view of the substrate 202 after a first mandrel structure formation process. Subsequent to the recess formation process depicted in FIG. 6, the recesses 602 may be laterally widened to form one or more first mandrel structures 702. The sidewalls 604 of the recesses 602 may be etched by either an isotropic or anisotropic etching process. In either embodiment, a halogen etchant material, such as a fluorine or chlorine containing material, may be utilized to further etch the substrate 202. As such, the etchant selected is selective to remove predominantly the material of the substrate 202 and is generally non-reactive with the material of the hardmask layer 204.

In the isotropic etching embodiment, a wet etching process may be performed. The wet etching process may generally be defined as a multi-directional process as opposed to an anisotropic etching process which removes material predominantly in one direction. The isotropic etching process may be time dependant and remove substrate material until a desired width 708 of the first mandrel structures 702 is achieved. The width 708 may be defined as the thickness of the first mandrels structures 702 between sidewalls 704 of the first mandrel structures. The width 708 may be between about 5 nm and about 15 nm, such as about 10 nm. The bottom surface 706 of the substrate after the isotropic etching process may be the same depth 606 as the bottom surface 608 or may be a greater depth, depending on the etching parameters utilized in the isotropic etching process.

In the anisotropic etching embodiment, etchants similar to the isotropic embodiment may be utilized but with parameters suitable for performing a predominantly lateral etching process. In this embodiment, the bottom surface 706 may maintain substantially the same depth 606 as the bottom surface 608. The anisotropic etching process may also proceed for a suitable amount of time to achieve the desired width 708 of the first mandrel structures. In one embodiment, the anisotropic etching process may be performed in a single processing chamber, such as one of the chambers 108a-108d.

FIG. 8 illustrates a partial, cross-sectional view of the substrate 202 after formation of a superlattice structure 801. The superlattice structure 801 comprises alternating layers 802, 804 of different materials. The alternating layers 802, 804 may be deposited on either the first mandrels structures 702 or on each other to form the superlattice structure 801. Although the superlattice structure 801 is illustrated as having only several alternating layers 802, 804, it is contemplated that a greater or lesser number of layers 802, 804 may be utilized according to the embodiments described herein.

In one embodiment, a first material layer 802 may be conformally deposited on the first mandrel structures 702 and the substrate 202. For example, the first material layer 802 may be epitaxially grown from the sidewalls 704 of the first mandrel structures 702 and from the bottom surface 706 (illustrated in detail in FIG. 7). A chamber suitable for performing the epitaxial deposition process is the CENTURA® RP EPI chamber available from Applied Materials, Inc., Santa Clara, Calif. However, it is contemplated that other chambers from other manufacturers may also perform the processes described.

The material of the first material layer 802 may be selected to be compatible with the material of the substrate 202 and the first mandrel structures 702. The first material layer 802 is generally selected to minimize lattice mismatches and dislocations which may be generated at the interface of the first material layer 802 and the substrate 202 and the first mandrel structures 702. For example, if the substrate 202 and the first mandrel structures 702 are formed from silicon, the first material layer 802 may be formed from a silicon germanium (SiGe) material, however, other suitable materials may also be utilized.

The first material layer 802 may be deposited in a manner such that the resulting dimensions of the first material layer 802 are suitable for subsequently forming advanced node FinFET structures. The first material layer 802 may be generally defined as having both horizontally and vertically extending regions having defined dimensions. A thickness 806 of a horizontally extending portion of the first material layer 802 may be between about 5 nm and about 15 nm, such as about 10 nm. A width 810 of a vertically extending portion of the first material layer 802 may be between about 5 nm and about 15 nm, such as about 10 nm.

In one embodiment, a second material layer 804 may be conformally deposited on the first material layer 802. For example, the second material layer 804 may be epitaxially grown from the first material layer 802. A chamber suitable for performing the second material epitaxial deposition process is the CENTURA® RP EPI chamber available from Applied Materials, Inc., Santa Clara, Calif. However, it is contemplated that other chambers from other manufacturers may also perform the processes described.

The material of the second material layer 804 may be selected to be compatible with the material of the first material layer 802. The second material layer 804 is generally selected to minimize lattice mismatches and dislocations which may be generated at the interface of the second material layer 804 and the first material layer 802. For example, if the first material layer 802 is formed from a silicon germanium material, the second material layer 804 may be formed from a silicon containing material, however, other suitable materials may also be utilized. In one embodiment, the second material layer 804 may be the same material as the material of the substrate 202.

The second material layer 804 may be deposited in a manner such that the resulting dimensions of the second material layer 804 are suitable for subsequently forming advanced node FinFET structures. The second material layer 804 may be generally defined as having both horizontally and vertically extending regions having defined dimensions. A thickness 808 of a horizontally extending portion of the second material layer 804 may be between about 5 nm and about 15 nm, such as about 10 nm. A width 812 of a vertically extending portion of the second material layer 804 may be between about 5 nm and about 15 nm, such as about 10 nm.

The superlattice structure 801 may be further formed by depositing the first material layer 802 on the second material layer 804 and by depositing second material layer 804 on the first material layer 802. The alternating layers 802, 804 may be deposited in a repeating fashion until a desired superlattice structure 801 has been formed. In one embodiment, the superlattice structure 801 is formed with dimensions similar to the dimensions of the patterned hardmask 204. For example, the alternating layers 802, 804 are deposited in a repeating fashion until the hardmask layer 204 covers vertically extending portions of the superlattice structure 801.

The conformal epitaxial deposition of the first material layer 802 and the second material layer 804 enable desirable superlattice structure formation due to the compatibility between the materials selected for the layers 802, 804. In one embodiment, an interface between the layers 802, 804 and the hardmask layer 204 may be controlled by providing an etchant gas during the epitaxial deposition of the layers 802, 804. For example, a suitable amount of a chlorine containing gas may be provided to prevent lattice mismatches and dislocations in the layers 802, 804 adjacent the interface with the hardmask layer 204. The chlorine containing gas may also facilitate conformal growth of the layers 802, 804 during the epitaxial deposition process.

FIG. 9 illustrates a partial, cross-sectional view of the substrate 202 after a hardmask removal process. FIGS. 9-15 illustrate various embodiments of a method for forming FinFET structures for a semiconductor device. One embodiment includes the processes described with regard to FIGS. 9-11. As illustrated, the hardmask layer 204 has been removed to expose the superlattice structure 801 and top surfaces 902, 904, of the first and second material layers 802, 804, respectively. In one example, the hardmask layer 204 is removed in a single etching process in a single chamber, such as one of the chambers 108e-108f. The hardmask layer 204 etching process may be a wet etching process or a dry etching process. In one example, the hardmask layer 204 is removed by a dry plasma etching process. Suitable process gases for forming a plasma suitable to remove the hardmask layer 204 include fluorocarbon gases, such as $CF_4$, $CHF_3$, and the like. The hardmask etching process may be performed with a source power of about 500 W and a bias power of about 100 W in an environment having a pressure less than about 20 mtorr.

FIG. 10 illustrates a partial, cross-sectional view of the substrate after a second mandrel structure formation process. A portion of the second material layer 804 may be removed to expose portions of the first material layer 802. For example, vertically extending portions of the second material layer 804 may be etched to expose vertically extending portions of the first material layer 802. As described hereinafter, the vertically extending portions of the first material layer will be referred to as second mandrel structures 802. It should be recognized that while the terminology used to refer to the first material layer 802 has changed to more clearly identify the structure associated with the first material layer 802, the second mandrel structures 802 and the first material layer 802 are formed from the same materials.

To form the second mandrel structures 802, the second material layer 804 may be removed with a selective dry plasma etching process. In one embodiment, the second material layer 804 etching process may be performed in one of the chambers 108a-108d. The etching process may utilize suitable process gases, such as chlorine or bromine gases, to form a suitable etching plasma. The second material layer etching process may be a time dependent anisotropic etching process. In one example, the second material layer etching process may be performed with a source power of about 1 kW and a bias of between about 100 W to about 1000 W, such as between about 200 W and about 600 W, in an environment having a pressure less than about 20 mtorr. As such, the second material layer 804 is predominantly removed, which results in the second mandrel structures 802 extending vertically from the substrate 202. The second material layer etching process may proceed for amount of time such that a portion of the vertically extending second material layer remains between adjacent second mandrel structures 802.

Recesses 1002 formed by the removal of portions of the second material layer 804 are generally defined by adjacent second mandrel structures 802. The recesses 1002 may have a depth 1004 of between about 100 nm and about 200 nm, such as about 150 nm. The depth 1004 may be defined as the distance between the top surface 904 of the second mandrel structures 802 and the top surface 904 of the second material layer 804. A pitch size defined by the second mandrel structures 802 may be between about 10 nm and about 30 nm, such as about 20 nm. The second pitch size is the summation of the width 810 and a width of a recess 1002 adjacent one of the second mandrel structures 802. The second mandrel structures 802 may be optionally exposed to oxygen in a sidewall passivation process.

Figure 11:
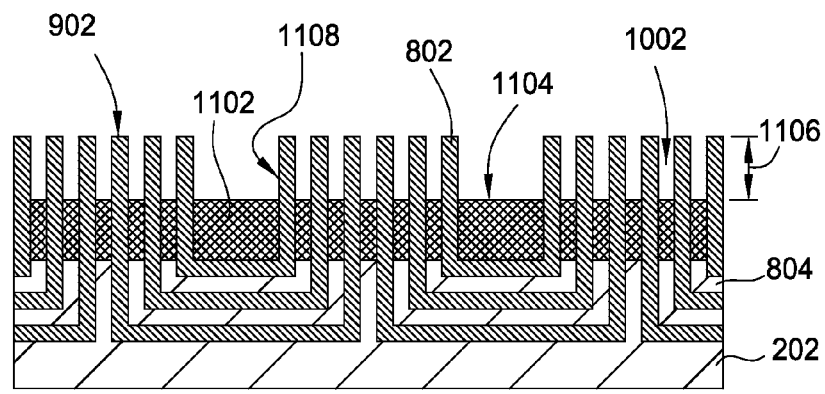
FIG. 11 illustrates a partial, cross-sectional view of a substrate after a dielectric deposition process.

FIG. 11 illustrates a partial, cross-sectional view of the substrate 202 after a dielectric deposition process. A dielectric layer 1102 may be an oxide material and may be deposited over the substrate 202, the second mandrel structures 802, and the second material layer 804 such that the dielectric layer 1102 fills the recesses 1002. The dielectric layer deposition process may be formed by a flowable CVD process. The dielectric layer 1102 is typically formed using a blanket deposition technique, filling the recesses 1002 and covering the second mandrel structures 802.

In one example of a flowable CVD process, an organosilicon precursor and an oxygen precursor at a temperature of about 100° C. or less may be provided form a flowable oxide layer. Suitable organosilicon precursors have a ratio of carbon atoms to silicon atoms less than 8. Suitable organosilicon compounds may also have a ratio of oxygen to silicon atoms of 0 to about 6, and may include an Si—O—Si linkage that facilitates formation of $SiO_x$ films with reduced contamination from carbon and hydroxyl groups. Suitable oxygen precursors may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors.

A carrier gas, for example, an inert gas, may also be provided with the organosilicon and oxygen precursors. The oxygen precursor may be activated prior to introduction to the chamber, for example using a remote plasma source, which may include thermal dissociation, ultraviolet light dissociation, RF, DC, and/or microwave dissociation. In one embodiment, about 4-6 kW of RF power may be coupled into a flow of about 900-1,800 sccm of argon and about 600-1,200 sccm of molecular oxygen. The organosilicon precursor may be provided to a deposition chamber separately from the oxygen precursor to prevent reactions outside the chamber. The organosilicon precursor may be introduced as a gas to the chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the chamber at a flow rate between about 3 sLm and about 20 sLm.

The precursors react to deposit a flowable oxide layer, or dielectric layer 1102, on the substrate 202. The CVD process described above may be implemented on a PRODUCER® CVD system available from Applied Materials, Inc., of Santa Clara, Calif. However, it is contemplated that other chambers from other manufacturers may also perform the processes described.

FIG. 11 additionally illustrates the dielectric layer 1102 being recessed below the top surface 902 of the second mandrel structures 802. The flowable dielectric deposition process will generally cover the top surface 902 prior to performing a planarization process which removes a portion of the dielectric layer 1102 to planarize the dielectric layer 1102. A CMP process may be utilized to planarize the dielectric layer 1102. The CMP process is performed such that the dielectric layer 1102 is substantially co-planar with the top surface 902 of the second mandrel structures 802. In this embodiment, the top surface 902 of the second mandrel structures 802 may be utilized as a hard stop for the CMP process to determine a polishing end point. The CMP process may be implemented on a REFLEXION® CMP system or other similar systems available from Applied Materials, Inc., Santa Clara, Calif. However, it is contemplated that other chambers from other manufacturers may also perform the processes described.

After the dielectric layer planarization process, the dielectric layer 1102 may be recessed such that a top surface 1104 of the dielectric layer 1102 is below the top surface 902 of the second mandrel structures 802 in the recesses 1002. In the embodiment illustrated, a portion of the dielectric layer 1102 remains on the substrate 202 in the recesses 1002 between adjacent second mandrel structures 802. The dielectric layer etching process exposes sidewalls 1108 of the second mandrel structures 802 which define the recesses 1002.

The dielectric layer etching process may be either a wet etch or dry etch. The dielectric layer etching process is generally selective to the material of the dielectric layer 1102 such that the dielectric layer 1102 is predominantly removed. The dielectric layer etching process may be an anisotropic etching process. In one example, the dielectric layer 1102 is etched utilizing a dry etch process with a fluorocarbon containing plasma. A $CF_4$ process gas may be flowed at a rate of about 500 sccm in an environment having a pressure of about 7 mT. The $CF_4$ may be energized into a plasma with an RF power of about 500 W and a bias of less than about 200 W and the etching process may proceed for about 45 seconds.

In the embodiment illustrated in FIG. 11, the second mandrel structures 802, which may comprise a silicon germanium material, may be utilized with subsequent processing operations to form a semiconductor device, such as a complimentary metal oxide semiconductor (CMOS) device.

Figure 12:
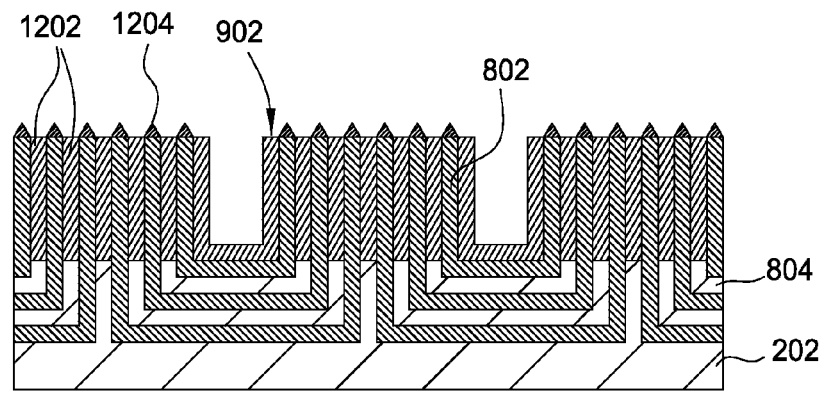
FIG. 12 illustrates a partial, cross-sectional view of a substrate after a third mandrel structure formation process.

FIG. 12 illustrates a partial, cross-sectional view of the substrate 202 after a third mandrel structure formation process. The embodiments performed in FIGS. 12-15 may be performed after the process described with regard to FIG. 10. Third mandrel structures 1202 may be formed in the recesses 1002 between adjacent second mandrel structures 802. In one embodiment, the third mandrel structures 1202 are epitaxially grown from the sidewalls 1108 of the second mandrel structures 802. As such, the third mandrel structures 1202 may nucleate on the sidewalls 1108 and grow laterally to fill the recesses 1002 between the second mandrel structures 802.

The third mandrel structure material is generally selected to minimize lattice mismatches and dislocations which may be generated at the interface of the second mandrel structures 802, i.e. the sidewalls 1108, and the third mandrel structures 1202. For example, if the second mandrel structures 802 are formed from a silicon germanium material, the third mandrel structures 1202 may be formed from a III-V material, however, other suitable materials may also be utilized. In one example, the nucleation of the third mandrel structure material is primarily limited to the sidewalls 1108 of the second mandrel structures 802 due to the growth rate of the III-V material on the SiGe material, which may be a single crystal material. It is believed that the third mandrel structure material nucleation on the second material layer 804 may be reduced or eliminated as a result of the amorphous or nano-crystal phase of the third mandrel structure material on the second material layer 804, which may be a silicon material. The third mandrel structure material may also nucleate and grow on the top surface 902 of the second mandrel structures 802, which is illustrated as portions 1204.

A chlorine material, such as $Cl_2$, may be provided in the processing chamber during the third mandrel structure material deposition process which results in removal of the amorphous and nano-crystal III-V material from the second material layer 804 at a rate faster than the III-V material growth rate on the second mandrel structures 802, which may be a single crystal material. In one embodiment, the third mandrel structures 1202 are formed by a selective epitaxial deposition process. Suitable precursors for forming the third mandrel structures 1202 include various III-V materials. A chamber suitable for performing the epitaxial deposition process is a CENTURA® RP EPI chamber available from Applied Materials, Inc., Santa Clara, Calif. However, it is contemplated that other chambers from other manufacturers may also perform the processes described.

Figure 13:
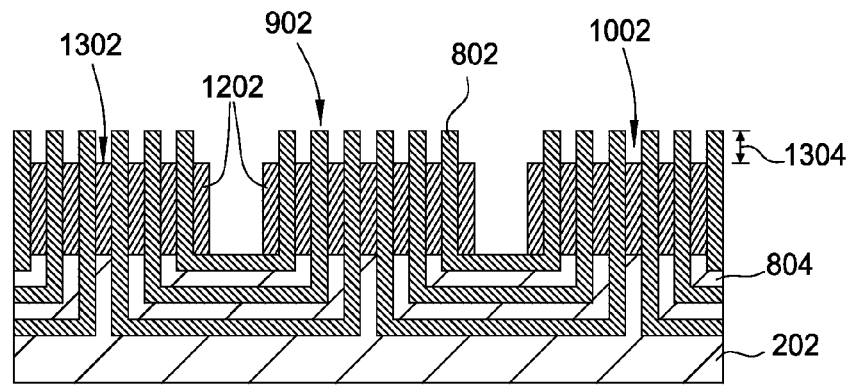
FIG. 13 illustrates a partial, cross-sectional view of a substrate after a third mandrel structure etching process.

FIG. 13 illustrates a partial, cross-sectional view of the substrate 202 after a third mandrel structure etching process. The third mandrel structures 1202 and the portions 1204 may be etched utilizing dry plasma etching process. The third mandrel structures 1202 and portions 1204 may be selectively etched such that a top surface 1302 of the third mandrel structures 1202 is below the top surface 902 of the second mandrel structures 802. The third mandrel structure etching process may be a time dependent anisotropic etching process.

Suitable process gases for forming a plasma to selectively etch the third mandrel structures 1202 and portions 1204 include fluorocarbon containing gases. The chemistry of the etchants chosen may etch both the third mandrel structures 1202 and the second mandrel structures 802, however, it is contemplated that the etchants utilized may be selected to etch the material of the third mandrel structures 1202 at a rate greater than the rate at which the second mandrel structures 802 are etched. In one embodiment, the third mandrel structures 1202 and portions 1204 may be etched in a selective etching chamber, such as one of the chambers 108a-108d. The top surface 1302 of the etched third mandrel structures 1202 may be recessed below the top surface 902 of the second mandrel structures by a depth 1304 of between about 5 nm and about 50 nm, such as between about 10 nm and about 20 nm.

Figure 14:
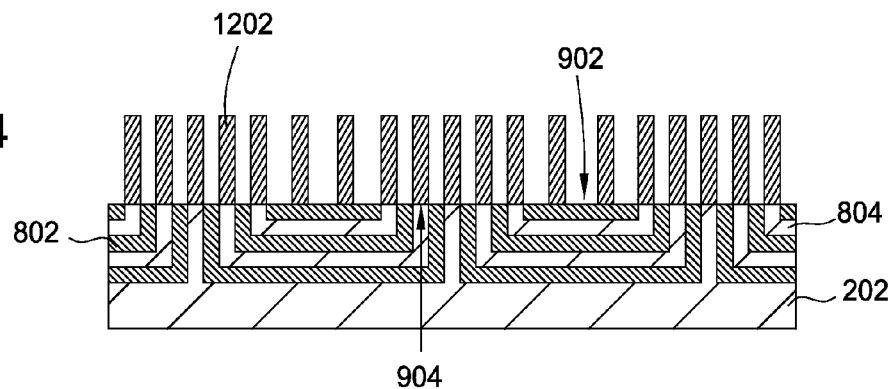
FIG. 14 illustrates a partial, cross-sectional view of a substrate after a second mandrel structure removal process.

FIG. 14 illustrates a partial, cross-sectional view of the substrate 202 after a second mandrel structure removal process. The second mandrel structures 802 may be removed to expose the third mandrel structures 1202. Suitable process gases for forming a plasma to selectively etch the second mandrel structures 802 include fluorocarbon containing gases, such as $CF_4$, $CHF_3$, and chlorine containing gases, such as $Cl_2$. Oxygen containing gases, such as $O_2$, and nitrogen containing gases, such as $N_2$, may also be utilized to enhance etch selectivity. The second mandrel structure etching process may be a selective anisotropic time dependent etching process which predominantly removes the second mandrel structures 802. In one embodiment, the second mandrel structures 802 may be etched in a selective etching chamber, such as one of the chambers 108a-108d.

The second mandrel structures 802 may be etched such that the remaining first material layer 802 and the second material layer 804 are substantially co-planar with one another. The third mandrel structures 1202 may extend vertically beyond the top surfaces 902, 904 of the remaining first and second material layers 802, 804, respectively.

Figure 15:
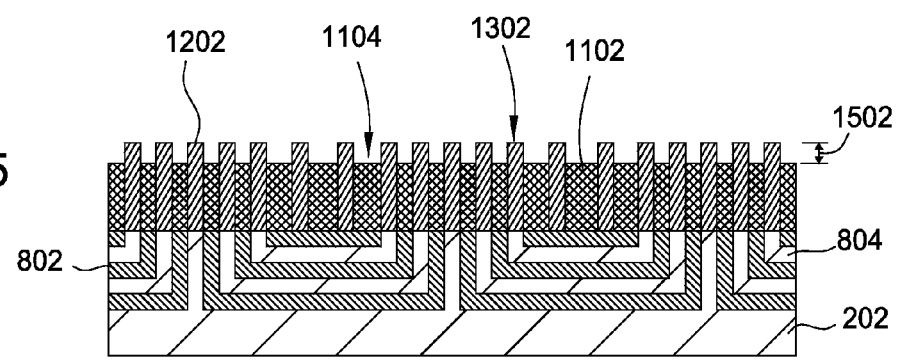
FIG. 15 illustrates a partial, cross-sectional view of a substrate after a dielectric deposition and etching process.

FIG. 15 illustrates a partial, cross-sectional view of the substrate 202 after a dielectric deposition and etching process. The dielectric layer 1102 may be deposited over the third mandrel structures 1202 and subsequently etched according to the embodiments described in detail with regard to FIG. 11. The top surface 1104 of the dielectric layer 1102 may be recessed a depth 1502 below a top surface 1302 of the third mandrel structures 1202. The depth 1502 may be between about 20 nm and about 60 nm, such as about 40 nm. The portions of the third mandrel structures 1202 disposed above the top surface 1104 of the dielectric layer 1102 may be utilized as FinFET structures and subsequently processed to form one or more semiconductor devices.

Figure 16:
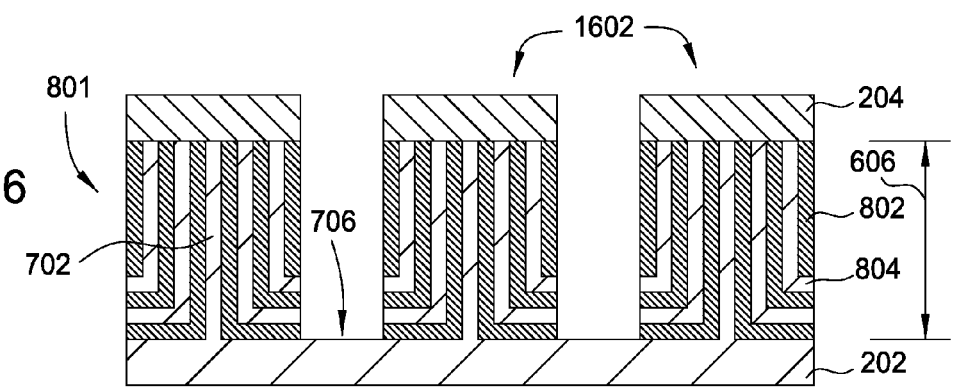
FIG. 16 illustrates a partial, cross-sectional view of a substrate after a superlattice etching process.
Figure 17:
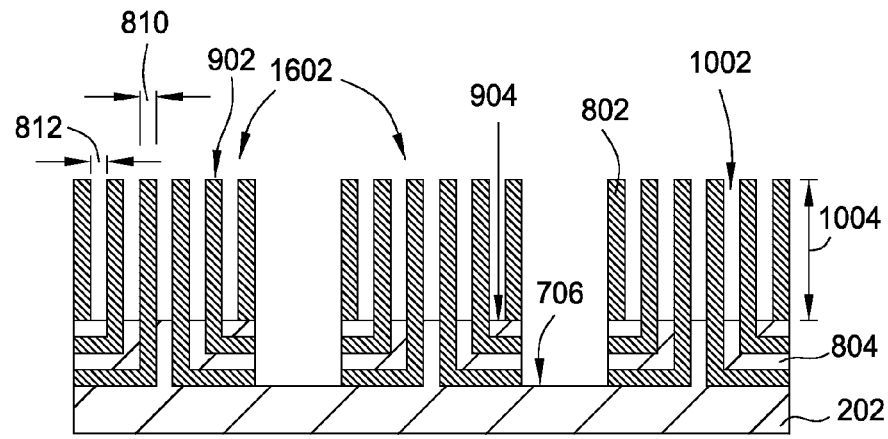
FIG. 17 illustrates a partial, cross-sectional view of a substrate after a hardmask layer removal process and second mandrel structure formation process.
Figure 18:
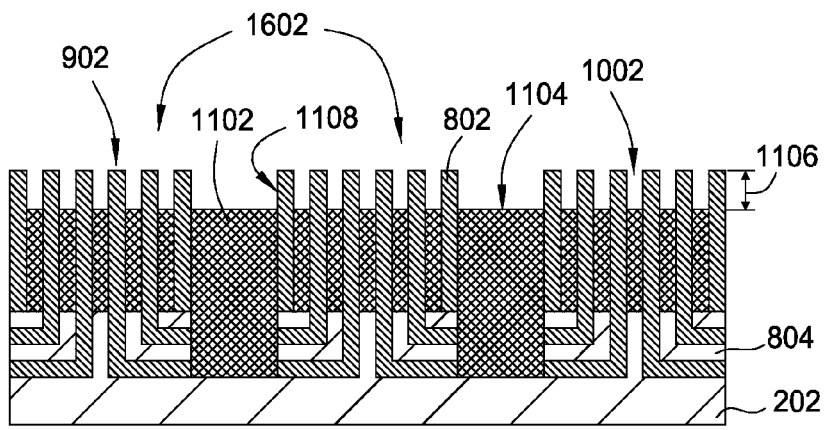
FIG. 18 illustrates a partial, cross-sectional view of a substrate after a dielectric layer deposition and etching process.

FIG. 16 illustrates a partial, cross-sectional view of the substrate 202 after a superlattice etching process. FIGS. 16-25 illustrate various embodiments of a method for forming FinFET structures for a semiconductor device. FIGS. 16-18 describe one embodiment of the methods described herein. Referring back to FIG. 8, the superlattice structure 801 depicted may be etched to expose the bottom surface 706 of the substrate 202. The hardmask layer 204 remains disposed on the superlattice structure 801 to define the pattern of the etching processes. The superlattice etching process may be an anisotropic etching process and may be time dependent in certain embodiments.

The first material layer 802 and the second material layer 804 may be etched to form discrete blocks 1602 of the superlattice structure 801. In one embodiment, the first material layer 802 and the second material layer 804 are etched in a single etching process utilizing etching chemistries suitable to remove both silicon and silicon germanium materials. In another embodiment, the first material layer 802 is etched in a first etching process and the second material layer 804 is etched in a second etching process. Suitable chemistries for etching the first and second material layers 802, 804 are described with regard to FIG. 10 and FIG. 14, respectively. In one embodiment, the anisotropic etching process may be performed in a single processing chamber, such as one of the chambers 108e-108f.

FIG. 17 illustrates a partial, cross-sectional view of the substrate 202 after the hardmask layer removal and second mandrel structure formation processes. The hardmask layer 204 may be removed with a process similar to the process described with regard to FIG. 9. The second mandrel structures 802 may be formed similar to the process described with regard to FIG. 10. As a result, the blocks 1602 have the second mandrel structures 802 formed thereon.

FIG. 18 illustrates a partial, cross-sectional view of the substrate 202 after a dielectric layer deposition and etching process. The dielectric deposition and etching process is similar to the processes described with regard to FIG. 11. In this embodiment, the blocks 1602 with the second mandrel structures 802 formed thereon are isolated from one another by the dielectric layer 1102.

Figure 19:
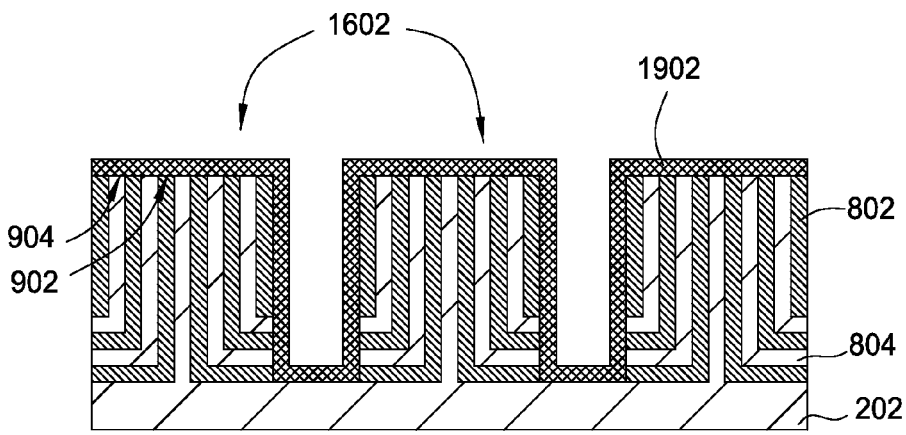
FIG. 19 illustrates a partial, cross-sectional view of a substrate after a hardmask removal process and spacer deposition process.

FIG. 19 illustrates a partial, cross-sectional view of the substrate 202 after a hardmask removal process and spacer deposition process. FIGS. 19-25 illustrate another embodiment for forming FinFET structures for a semiconductor device. The processes illustrated in FIG. 19 may be performed after the processes described in FIG. 16. The hardmask layer 204 may be removed in a manner similar to the process described with regard to FIG. 9. After the hardmask layer removal, a spacer layer 1902 may be formed over the blocks 1602 and the substrate 202. More specifically, the spacer layer 1902 may be formed over the top surfaces 902, 904 of the first and second material layers, respectively, and the bottom surface 706 of the substrate 202. The spacer layer 1902 may be deposited in a conformal manner and may comprise an oxide or nitride material. The spacer layer deposition process may be performed by an atomic layer deposition (ALD) process. It is believed that the spacer layer 1902 may function to protect sidewalls of the superlattice blocks 1602 during subsequent etching processes. A suitable apparatus for deposition of the spacer layer 1902 is the PRODUCER® CVD chamber available from Applied Materials, Inc., Santa Clara, Calif. However, it is contemplated that other chambers from other manufacturers may be utilized to deposit the spacer layer 1902.

Figure 20:
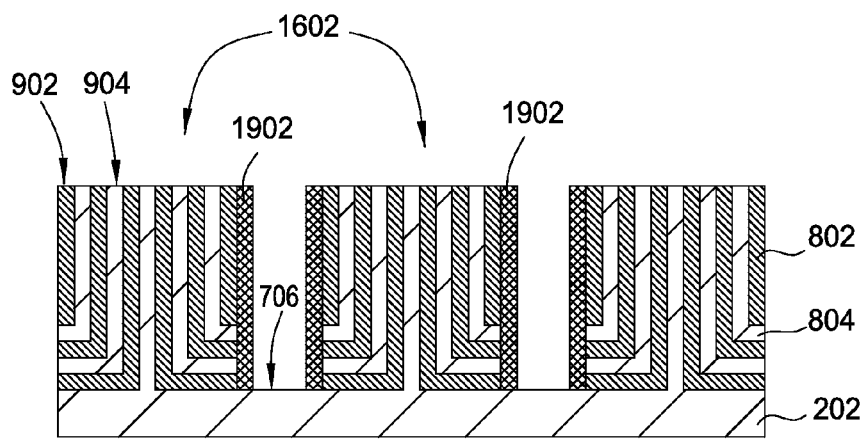
FIG. 20 illustrates a partial, cross-sectional view of a substrate after a spacer etching process.

FIG. 20 illustrates a partial, cross-sectional view of the substrate 202 after a spacer etching process. The spacer layer 1902 may be etched by a selective anisotropic etching process. In one embodiment, the spacer etching process may utilize a dry plasma etching process. Suitable process gases for forming an etching plasma include fluorocarbon containing materials, such as $CF_4$, and the like. The spacer layer 1902 may be etched for a suitable amount of time to expose the top surfaces 902, 904 of the first and second material layers 802, 804 and the bottom surface 706 of the substrate 202. The spacer etching process may remove predominantly the spacer layer 1902 and may be generally non-reactive with the other types of materials comprising the other features formed on the substrate 202. In one embodiment, the spacer etching process may be performed in a single processing chamber, such as one of the chambers 108a-108f.

Figure 21:
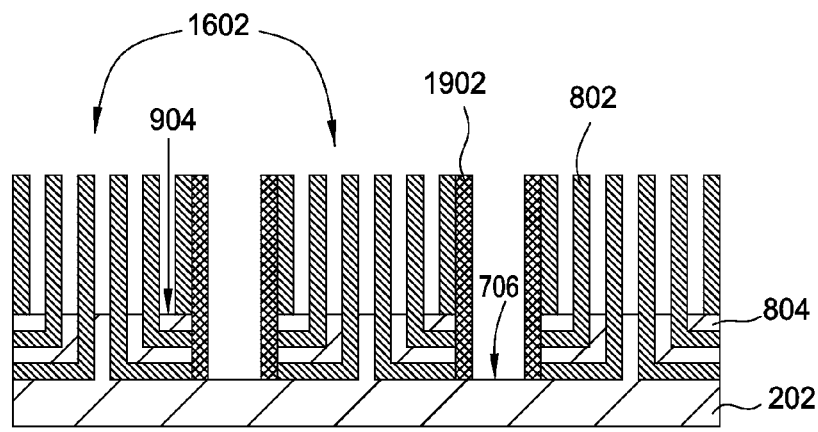
FIG. 21 illustrates a partial, cross-sectional view of a substrate after a second mandrel structure formation process.

FIG. 21 illustrates a partial, cross-sectional view of the substrate 202 after a second mandrel structure formation process. The second mandrel structures 802 may be formed similar to the processes described with regard to FIG. 10 and FIG. 17. The etching of the second material layer 804 may be selective and remove predominantly the material of the second material layer 804. The second mandrel structures 802 and the spacer layer 1902 may remain substantially un-etched during the second mandrel structure formation process as a result of the chemistries selected to perform the etching process.

Figure 22:
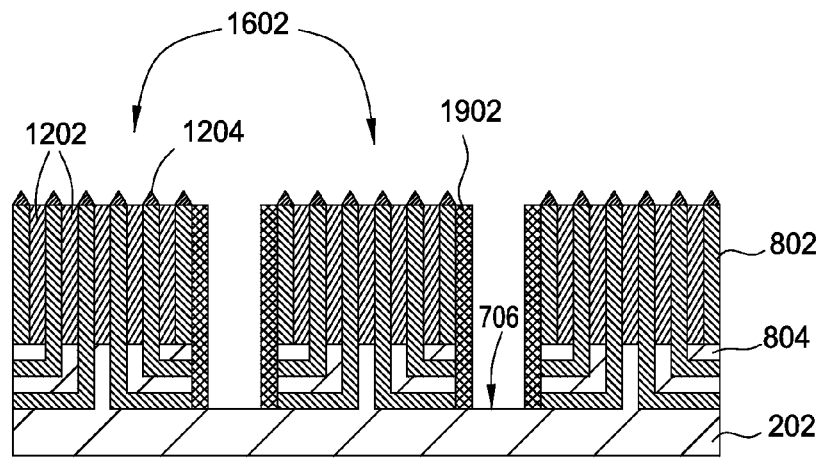
FIG. 22 illustrates a partial, cross-sectional view of a substrate after a third mandrel structure formation process.

FIG. 22 illustrates a partial, cross-sectional view of the substrate 202 after a third mandrel structure formation process. The third mandrel structures 1202 may be formed by a selective epitaxial deposition process similar to the process described with regard to FIG. 12. Although not shown, the material utilized for the third mandrel structures 1202 may nucleate and grow from the bottom surface 706 of the substrate 202 in certain embodiments, but may be subsequently removed during the etching process described with regard to FIG. 23.

Figure 23:
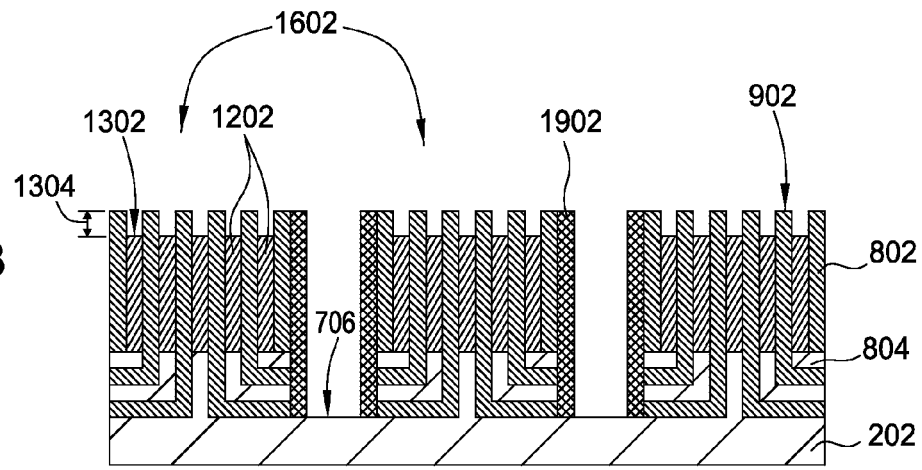
FIG. 23 illustrates a partial, cross-sectional view of a substrate after a third mandrel structure etching process.

FIG. 23 illustrates a partial, cross-sectional view of the substrate 202 after a third mandrel structure etching process. The third mandrel structures 1202 may be etched by a process similar to the process described with regard to FIG. 13. As previously mentioned, any third mandrel structure material that may have been deposited on the bottom surface 706 of the substrate 202 may be removed during the third mandrel structure etching process.

Figure 24:
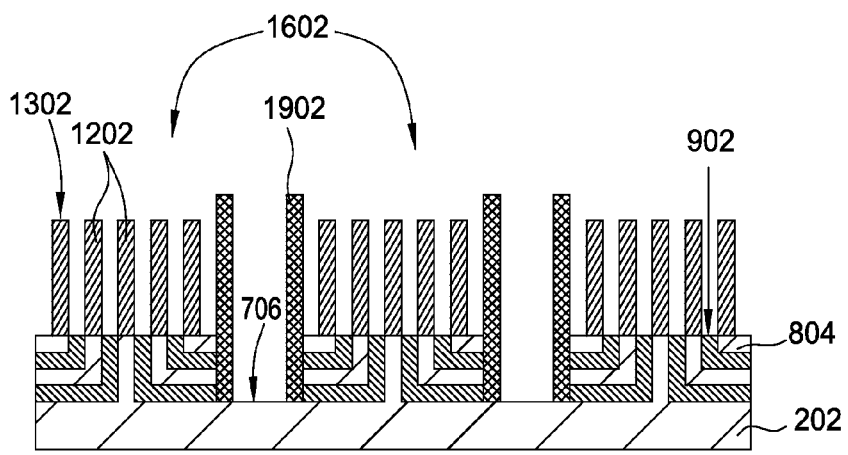
FIG. 24 illustrates a partial, cross-sectional view of a substrate after a second mandrel structure removal process.

FIG. 24 illustrates a partial, cross-sectional view of the substrate 202 after a second mandrel structure removal process. The second mandrel structure 802 may be removed by a process similar to the process described with regard to FIG. 14. The horizontally disposed portions of the first material layer 802 and the second material layer 804 of the blocks 1602 are protected during the etching processes described in FIG. 21, FIG. 23, and FIG. 24 by the spacer layer 1902. Thus, the spacer layer 1902 enables the blocks 1602 to maintain a requisite degree of structural integrity during the etching processes.

Figure 25:
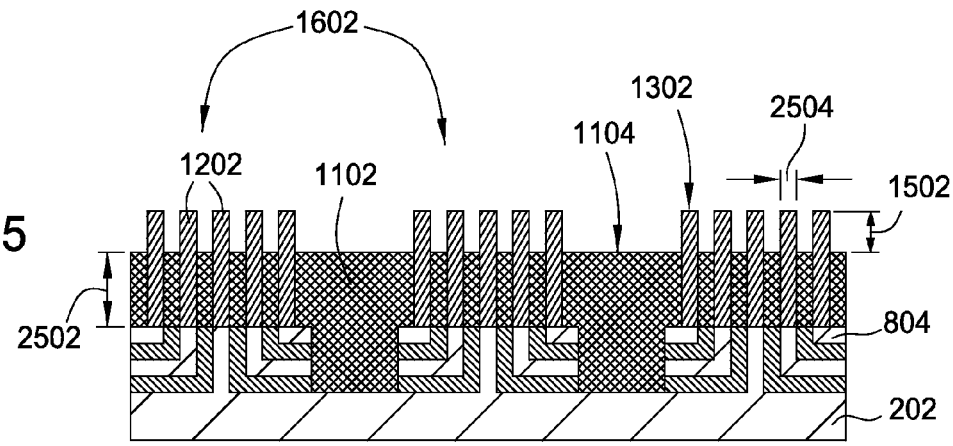
FIG. 25 illustrates a partial, cross-sectional view of a substrate after a dielectric layer deposition and etching process.

FIG. 25 illustrates a partial, cross-sectional view of the substrate 202 after a dielectric layer deposition and etching process. The dielectric deposition and etching may be performed similar to the processes described with regard to FIG. 11, FIG. 15, and FIG. 18. The spacer layer 1902 may be planarized and subsequently etched during the dielectric layer planarization and etching processes. In one embodiment, the spacer layer 1902 and the dielectric layer 1102 may be the same material. A thickness 2502 of the dielectric layer 1102 disposed on the blocks 1602 may be between about 50 nm and about 150 nm, such as about 100 nm. A width 2504 of the third mandrel structures 1202 may be between about 5 nm and about 15 nm, such as about 10 nm. It is contemplated that all of the FinFET structures (mandrel structures) may have a width similar to the width 2504 to enable sub 10 nm node device manufacturing.

The methods and apparatus described herein provide for the manufacture of sub-10 nm node FinFET structures while reducing patterning costs. The selective deposition and etching processes described herein may additionally be utilized to form the fin structures that transition from a silicon material to a III-V material in a manner that minimizes or prevents crystallographic dislocations and mismatches while forming suitable FinFET structures.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device, comprising:
   patterning and etching a substrate to form one or more first mandrel structures;
   conformally depositing a first material layer on the substrate and the first mandrel structures;
   conformally depositing a second material layer on the first material layer;
   conformally depositing a third material layer on the second material layer, wherein the third material layer is the same material as the first material layer;
   conformally depositing a fourth material layer on the third material layer, wherein the fourth material layer is the same material as the second material layer
   removing a portion of the first mandrel structures and the second material layer to form a plurality of second mandrel structures; and
   conformally depositing a III-V material layer on the plurality of second mandrel structures.

2. The method of claim 1 further comprising:
   depositing a dielectric material over the substrate between adjacent second mandrel structures.

3. The method of claim 1, further comprising:
   removing the plurality of second mandrel structures to form a plurality of third mandrel structures.

4. The method of claim 3, further comprising:
   depositing a dielectric material over the substrate between adjacent third mandrel structures.

5. The method of claim 1, wherein the substrate and the one or more first mandrel structures comprise a silicon containing material.

6. The method of claim 5, wherein the first material layer comprises a silicon germanium material.

7. The method of claim 6, wherein the second material layer is the same material as the substrate and the one or more first mandrel structures.

8. A method of forming a semiconductor device, comprising:
   patterning and etching a substrate to form one or more first mandrel structures;
   conformally depositing a first material layer on the substrate and the first mandrel structures;
   conformally depositing a second material layer on the first material layer;
   conformally depositing a third material layer on the second material layer, wherein the third material layer is the same material as the first material layer;
   conformally depositing a fourth material layer on the third material layer, wherein the fourth material layer is the same material as the second material layer to form a superlattice structure;
   masking a portion of the superlattice structure; and
   removing an unmasked portion of the superlattice structure to expose a portion of the substrate.

9. The method of claim 8, further comprising:
   removing a portion of the first mandrel structure, the second material layer, and the fourth material layer to form a plurality of second mandrel structures.

10. The method of claim 9, further comprising:
depositing a dielectric material over the exposed portions of the substrate and between adjacent second mandrel structures.

11. The method of claim 8, wherein the substrate, the first mandrel structures, the second material layer, and the fourth material layer comprise a silicon material.

12. The method of claim 11, wherein the first material layer and the third material layer comprise comprises a silicon germanium material.

13. The method of claim 8, further comprising:
removing the mask on a portion of the superlattice structure and conformally depositing a dielectric material over the substrate and the superlattice structure.

14. The method of claim 13, further comprising:
removing a portion of the conformally deposited dielectric material.

15. The method of claim 14, further comprising:
removing a portion of the first mandrel structures, a portion of the second material layer, and a portion of the fourth material layer to form a plurality of second mandrel structures.

16. The method of claim 15, further comprising:
conformally depositing a III-V material layer between adjacent second mandrel structures.

17. The method of claim 16, further comprising:
removing the second plurality of mandrel structures to form a third plurality of mandrel structures.

18. The method of claim 17, further comprising:
depositing a dielectric material over the substrate and between adjacent third mandrel structures.

19. A method of forming a semiconductor device, comprising:
epitaxially depositing a first silicon germanium material layer on a silicon substrate having one or more silicon mandrel structures formed thereon;
epitaxially depositing a first silicon layer on the first silicon germanium layer;
epitaxially depositing a second silicon germanium layer on the first silicon layer;
epitaxially depositing a second silicon layer on the second silicon germanium layer;
epitaxially depositing a third silicon germanium layer on the second silicon layer to form a superlattice structure;
removing a portion of the one or more silicon mandrel structures, the first silicon layer, and the second silicon layer to form a plurality of silicon germanium mandrel structures;
epitaxially depositing a III-V material on sidewalls of the silicon germanium mandrel structures; and
removing the silicon germanium mandrel structures to form a plurality of III-V material mandrel structures.

* * * * *

UNITED STATES PATENT AND TRADEMARK OFFICE
CERTIFICATE OF CORRECTION

PATENT NO. : 9,530,637 B2  
APPLICATION NO. : 14/875013  
DATED : December 27, 2016  
INVENTOR(S) : Ying Zhang et al.

Page 1 of 1

It is certified that error appears in the above-identified patent and that said Letters Patent is hereby corrected as shown below:

In the Specification

In Column 2, Line 36, delete "epiaxially" and insert -- epitaxially --, therefor.

In the Claims

In Column 16, Line 29, in Claim 2, delete "1" and insert -- 1, --, therefor.

In Column 17, Line 10, in Claim 12, after "comprise" delete "comprises".

Signed and Sealed this  
Fourteenth Day of March, 2017

Michelle K. Lee  
*Director of the United States Patent and Trademark Office*